5/5/87 03 000,275

United States Statutory Invention Registration [19]

[11] Reg. Number: H275

[43] Published: May 5, 1987

Milberger et al.

[54] PULSE MODULATOR

[75] Inventors: Walter E. Milberger, Severna Park; Franklin B. Jones, Baltimore; Charles S. Kerfoot, Pasadena, all of Md.

[73] Assignee: The United States of America as represented by the Secretary of the Army, Washington, D.C.

[21] Appl. No.: 877,607

[22] Filed: Jun. 13, 1986

[51] Int. Cl.[4] ..... H03L 5/00; H03K 17/687

[52] U.S. Cl. ..... 307/264; 307/571

*Primary Examiner*—Steven C. Buczinski
*Assistant Examiner*—Linda J. Wallace
*Attorney, Agent, or Firm*—Anthony T. Lane; Sheldon Kanars; John K. Mullarney

[57] ABSTRACT

A low level input pulse signal from $T^2L$ logic is delivered to the input of a ground deck driver which is transformer-coupled to a floating deck driver. The leading edge of the input pulse serves to enable or trigger a first FET driver, which is coupled to the gates of a plurality of series-connected FETs via a first transmission line transformer. The triggering of the FET driver serves to turn-on the series-connected FETs so that the same delivers a high voltage signal to an output load. A second FET driver is coupled to the gates of another plurality of series-connected FETs, which serve as a "tail-biter" to terminate the power to the output load. And, a third FET driver is coupled to the gates of the first-mentioned series-connected FETs to turn the same to the OFF state. The second and third FET drivers are coupled to their respective series-connected FETs via respective transmission line transformers. The trailing edge of the input trigger pulse enables the second and third FET drivers to concurrently turn-on the tail-biter FETs and turn-off the first-mentioned, series-connected FETs.

8 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

PULSE MODULATOR

STATEMENT OF GOVERNMENT RIGHTS

The Government has rights in this invention pursuant to Contract No. DAAK20-83-C-0390 ordered by the Department of the Army.

TECHNICAL FIELD

The present invention relates to a high voltage nanosecond pulse modulator which employes field effect transistros.

BACKGROUND OF THE INVENTION

The patent to W. E. Milberger (a co-inventor of the present invention) U.S. Pat No. 4,425,518, issued Jan. 10, 1984, discloses field effect transistor (FET) pulse apparatus which provides high voltage pulse of short duration. The pulse apparatus of the patent is capable of providing pulse voltages of several kilovolts with pulse widths of approximately 20 nanoseconds (nsec). The patented pulse modulator was designed for use with the transmitter of ECM systems, for example.

The transmitters of advanced MMW (millimeter wave) radar systems require higher voltage pulses, of shorter duration, than the pulse modulator of the patent can deliver. The same is true for the pulses required to trigger the Pockels cell of advanced, high power, laser transmitters. Moreover, these more advanced systems require (modulation) pulses which have a very fast "fall-time" that is at least equal to the turn on or "rise-time". The pulses produced by the pulse apparatus of the cited patent have a relatively slow fall-time; i.e., the fall-time is considerably slower than the rise-time.

SUMMARY OF THE INVENTION

It is a primary object of the present invention to provide a pulse modulator that produces pulses of very high voltage, yet of extremely short duration.

A related object of the invention is to provide pulses which have a very fast fall-time substantially equal to their rise-time.

These and other objects are attained in accordance with the present invention wherein a conventional trigger pulse is utilized to initiate the high voltage nanosecond pulse generation operation. The trigger pulse is coupled to a plurality of FET drivers via ground deck-to-floating deck transformer coupling. A first FET driver is coupled to the gates of a plurality of series-connected FETs via a first transmission line, power splitting, transformer. The leading edge of the trigger pulse enables the first FET driver to turn the series-connected FETs to an "ON" state and thereby deliver a high voltage signal to an output load (e.g., the control element of a MMW transmitter tube). A second FET driver is coupled to the gates of another plurality of series-connected FETs, which serve as a "tail biter" to terminate abruptly the power to the output load. And, a third FET driver is coupled to the gates of the first-mentioned series-connected FETs to turn the same to the "off" state. The second and third FET drivers are coupled to their respective series-connected FETs via respective transmission line, power splitting, transformers. The trailing edge of the input trigger pulse enables the second and third FET drivers to concurrently turn-on the tail-biter FETs and turn-off the first-mentioned, series-connected FETs.

BRIEF DESCRIPTION OF THE DRAWINGS

The invention will be more fully appreciated from the following detailed description when the same is considered in connection with the accompanying drawings, in which.

DETAILED DESCRIPTION

The pulse modulator circuit of the present invention will first be briefly described in functional terms to provide a general understanding of the operation thereof. This will be followed by a detailed explanation of the various design features of the invention which have proved to be particularly advantageous in the production of the desired high voltage (up to 20 kilovolts), short duration (e.g. 10 nsec.) pulses. The pulse modulator, in fact, is capable of producing pulses ranging in width from 10 nsec to 1.0 sec. or more (even up to d-c).

Figure 1:
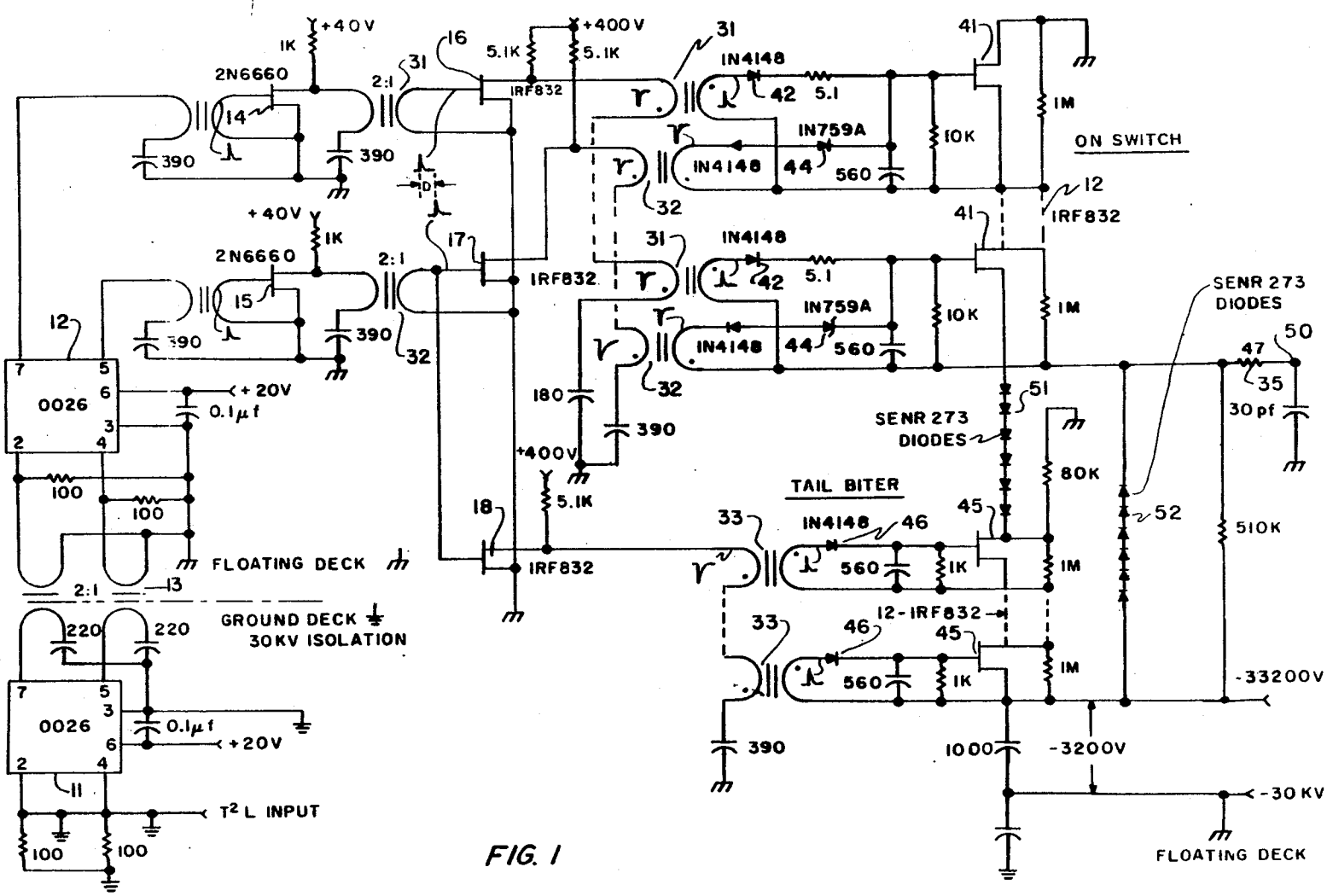
FIG. 1 is a schematic circuit diagram of a high voltage, nanosecond, pulse modulator in accordance with the present invention.

The FIG. 1 shows the modulator used as a floating deck pulser. The ground deck references are designated as ⏚ and the floating deck references (e.g., transmitter tube cathode potential) are designated as ⏚. The floating deck portion of the pulser is controlled from on-off trigger pulse commands derived from the ground deck. These on-off trigger pulse inputs are generated by $T^2L$ logic, for example, and are applied to the input of the DS-0026 two-phase ground deck driver 11. As in the cited patent, the input trigger pulses are of limited pulse amplitude (e.g. 5-20 volts). When terminals 2 and 4 of driver 11 are tied together, a floating deck ON trigger, corresponding to the leading edge of the $T^2L$ input pulse, will appear at terminal 2 of the floating deck driver 12. This is accomplished by the coupling transformer 13 which provides both pulse differentiation and high voltage isolation. The 0026 drivers 11 and 12 are power amplifiers, which are commercially available from National Semiconductor Inc., for example. The floating deck driver 12 provides triggers to the pair of 2N6660 FET drivers 14 and 15. The trigger to the gate of FET driver 14 corresponds to the leading edge of the $T^2L$ input pulse, and the trigger to the gate of FET driver 15 corresponds to the trailing edge of the same. The drivers 14 and 15, in turn, supply gate drive to the on-off IRF832 transmission line drivers 16, 17 and 18, via the transformers 31 and 32.

Each of the three FET drivers 16-18 provides a 400 volt trigger signal to twelve ferrite toroid cores which charges or discharges the input gate capacitance(s) of a respective series-connected FET chain, as will now be described.

The FET driver 16 is enabled or turned on prior to the enabling of the FET drivers 17 and 18. This is illustrated in FIG. 1 wherein the trigger input to the gate of FET 16 precedes the trigger applied to the gates of FETs 17 and 18 by an amount or duration D, which is typically equal to the pulse width of the $T^2L$ input pulse. Prior to a gate trigger input, the drains of FETs 16-18 are essentially at the +400 volts. The source leads of FETs 16-18 are connected to floating deck ground and, therefore, when the FETs are triggered or turned on the drain leads of these FETs drop precipitously in voltage and a negative 400 volt trigger signal is developed and delivered to the transformer cores connected thereto.

Three transmission line transformers 31–33 are utilized in accordance with the invention, each of which comprises a plurality of primary and secondary windings (e.g., effectively twelve primaries and, of course, twelve secondaries each). These unique transmission line transformers will be described in detail hereinafter. The primaries of transformers 31–33 are respectively connected to the drain leads of the FET drivers 16–18. The gates of the series-connected FETs 41 (twelve in number) are respectively connected to the twelve secondaries of transmission line transformer 31 via the diodes 42. As indicated by the conventional use of dots on the primary and secondary windings of transformer 31, the negative trigger in the primaries is inverted to a positive trigger in the secondaries and the same is coupled to the gates of the FETs 41. Thus, the series-connected FETs 41 are turned on simultaneously and serve to deliver a high voltage signal to the output 30 via the small resistance (47 ohms) 35. The series-connected FETs therefore function as an "ON switch".

The primaries of transmission line transformer 32 are connected to the drain lead of FET 17. When the FET 17 is turned on, at a time corresponding to the trailing edge of the input $T^2L$ pulse, a negative trigger is generated in the primary windings of transformer 32 and this translates to a negative trigger in the secondaries of transformer 32, as suggested by the dots in the primaries and secondaries of the latter transformer. As will be apparent to those in the art, this is accomplished by a simple reverse connection to these secondaries. The negative trigger in the secondaries of transformer 32 is coupled to the gates of the series-connected FETs 41 via the zener diodes 44. As will be explained in greater detail hereinafter, the negative trigger serves to abruptly turn-off the FETs 41.

The primaries of transmission line transformer 33 are connected to the drain lead of FET 18. Since the FETs 17 and 18 are enabled concurrently, a negative trigger occurs in the primaries of transformer 33 simultaneously with the negative trigger in the primaries of transformer 32. This results in a positive trigger in the secondaries (twelve) of transformer 33, which is coupled to the gates of the series-connected FETs 45 via the diodes 46. Thus, the (twelve) series-connected FETs 45 are turned on in unison and this serves to terminate the high voltage output signal at output 30. And, more importantly, the FETs 45 which comprise a "Tail Biter" switch are turned on substantially concurrently with the turn off of the FETs 41 which comprise the "On Switch".

As previously indicated, the ground deck driver 11 accepts low level input signals from $T^2L$ logic, for example, and the same is transformer-coupled to the floating deck driver 12. Five inches of creepage distances is used to isolate the two decks. However, if only limited pulse widths are required (25–400 nsec), the pulser may be operated on the ground deck using a coupling capacitor.

The 0026 ground deck pulser 11 can be connected to either lengthen or shorten the $T^2L$ input pulse width. To shorten the pulse, the length of line (e.g., coaxial) between the terminals 2 and 4 is increased; i.e., the line provides added delay and the leading edge trigger at terminal 2 is thus closer in time to the trailing edge trigger at terminal 4 to thereby effectively shorten the appearance of the input pulse width. Conversely, to lengthen the pulse the $T^2L$ input is applied to terminal 2 with the extended line between the two input terminals. For pulse widths in excess of 5 microseconds, terminals 2 and 4 are separated. ON triggers are then supplied to terminal 2 at about the 200 kHz rate. This sustains the modulator output pulse as long as desired. The pulse length can be terminated by ceasing the input to terminal 2 and then applying a single OFF trigger to terminal 4.

Both the "ON Switch" and "Tail Biter" transistor chains use diode gate input circuits to charge the gate input capacitance of the FETs. A negative OFF trigger is used to discharge the FET input capacitance for reset. This is done by applying a −20 volt pulse to the anode of the 12 volt (IN759A) zener which is coupled to the FET 41 gates. Since the FET gate is charged up to +12 volts prior to the application of the OFF trigger, the negative −20 volt pulse provides a rapid discharge for reset. This insures that the ON Switch is hard off when the Tail Biter switch is triggered. To reduce the capacitance which the ON Switch sees, back-bias diodes 51 (6-SENR 273s) are used to isolate capacitance of the Tail Biter from the ON Switch. The back-bias recharge tine is approximately 10 microseconds after the Tail Biter is triggered This time constant also establishes the maximum pulse repetition frequency (e.g., PRF=50 kHz) at which the pulser may be operated without Tail Biter capacitance loading.

The 47-ohm series output resistance 35 provides load damping and current limiting for tube arcing conditions. Positive going transient currents that flow as a result of tube arcing are diverted to the floating deck via the internal diodes that shunt each ON chain transistor. Conversely, negative going currents are diverted to the −33,200 v. supply through the SENR 273 diodes 52 that juncture at the pulser output. It may be necessary to shunt the 3200 volt pulser supply with a zener or spark gap to limit the level to which the pulser storage capacitance charges during negative going transients.

An advantageous design feature is the inclusion of a shunt discrete capacitance (560 pf) from the gate to source of all ON and OFF switch FETs. This capacitance suppresses parasitic oscillations and prevents the FETs from turning back on via the Miller integration capacitance when the device is programmed to turn off.

Another advantageous design feature is the inclusion of the 5.1 ohm resistance placed in series with each gate input diode 42. The resistance limits the reverse recovery current through the diode when the gate command is initiated. As a result of this feature, pulse "after birth" (false turn on after the off command is completed) is prevented.

Figure 2:
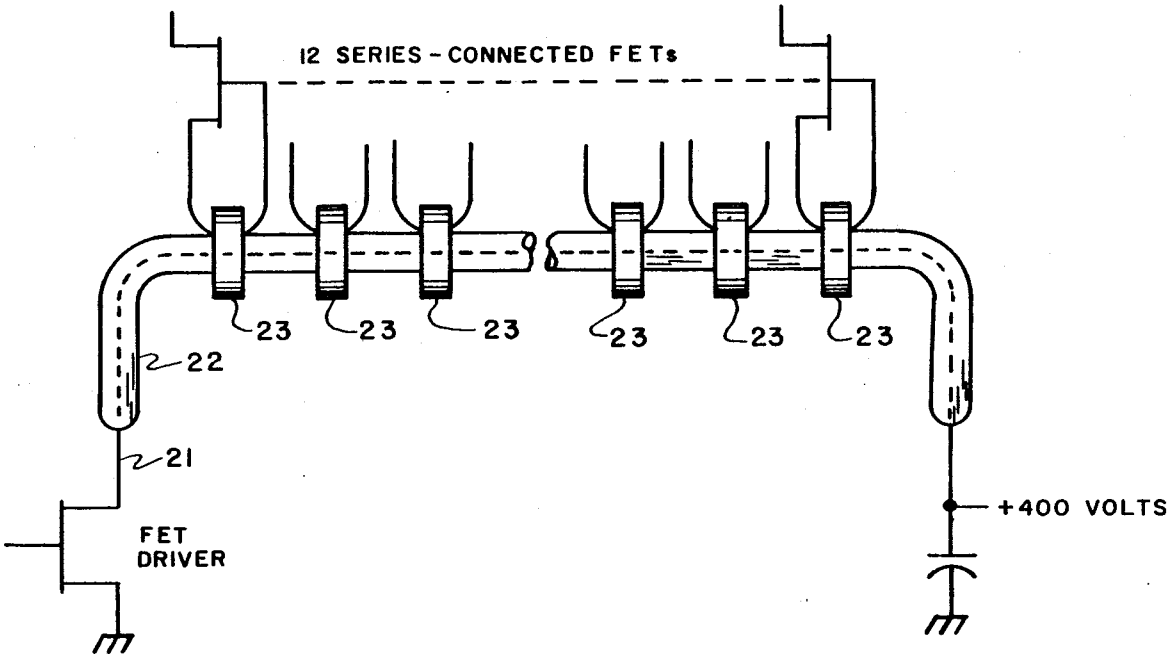
FIG. 2 illustrates a transmission line, power splitting, transformer utilized in accordance with the invention.

The transmission line transformers 31–33 are constructed in the manner shown in FIG. 2 of the drawings. A copper wire 21 is centrally disposed inside a cylindrical tube 22 of glass or quartz, for example, of approximately one-quarter inch diameter. The wire 21 serves as the primary winding. Twelve toroid cores 23 are spaced, equidistantly, along a length of the tube. The toroid cores are, of course, the secondaries and each is connected to one of twelve series-connected FETs. This transmission line, power splitting, transformer configuration provides a number of particularly advantageous features, namely: equal power splitting with a very high cut-off frequency; voltage isolation between adjacent cores; inner to outer conductor voltage isolation greater than 100 kilovolts (limited only by creepage distance, if glass dielectric rods are used); and, extremely low primary to secondary capacitance from 1 to 4 pf. (this extends the cut-off frequency of the line and permits series operation of FET transistors).

The pulse modulator of the present invention was developed primarily for the purpose of modulating the control element (modulation anode, aperture grid, shadow grid or intercept grid) of millimeter wave transmitter tubes. However, since the present modulator is capable of providing pulse voltages up to 20 kilovolts it can be readily utilized with other and different apparatus using control elements, including cathode and deflection plates. Such apparatus include many categories of r-f. vacuum tubes and CRTs. Furthermore, the fast turn-on response of the instant device can greatly improve the overall transport delay of ECM transponders. For faster pulse rise and fall times, the circuit may be configured as an MHP (multichip hybrid package) to minimize the restricting circuit inductance. In the spirit of the invention, the pulse modulator can also be used as a pulse width regulator and d-c to d-c chopper converter, as similarly noted in the cited patent.

The FET transistor types indicated in FIG. 1 of the drawings are commerically available devices and, moreover, are only given by way of example. As will be obvious to those in the art, other known transistor types may be readily substituted for those indicated in FIG. 1. For example, for the IRF832 FETs one could readily substitute TP4N50 FET devices, which are also commercially available. The above is also true for the diode types indicated in FIG. 1. The indicated values for the resistances, capacitances, and bias supplies are intended to be merely exemplary and the modulator of the invention is in no way limited thereto. For a 20 kilovolt output, for example, substantially larger bias supplies would be necessary. Without further belaboring the point, it should be obvious at this time that the above-described arrangement is merely illustrative of the application and of the principles of the present invention and numerous modifications thereof may be devised by those skilled in the art without departing from the spirit and scope of the invention.

What is claimed is:

1. Apparatus for generating a high voltage, short duration, pulse signal in response to a low level input pulse signal comprising a ground deck driver means transformer-coupled to a floating deck driver means, means for delivering said input pulse to said ground deck drive means, said floating deck driver means serving to generate a first trigger pulse which corresponds to the leading edge of said input pulse and a second trigger pulse which corresponds to the trailing edge of the same, a first FET driver means coupled to the gates of a plurality of series-connected FETs and responsive to said first trigger pulse to enable said series-connected FETs to deliver a high voltage signal to an output load, a second FET driver means coupled to the gates of a second plurality of series-connected FETs and responsive to said second trigger pulse to enable said second plurality of FETs to terminate said high voltage signal, and a third FET driver means also coupled to the gates of the first-mentioned series-connected FETs and responsive to said second trigger pulse to disable said first-mentioned series-connected FETs.

2. Apparatus as defined in claim 1 wherein said first-mentioned series-connected FETs are disabled substantially concurrently with the enabling of said second plurality of FETs.

3. Apparatus as defined in claim 2 including three transmission line power splitting transformers, each of which serves to couple a respective one of said FET driver means to said series-connected FETs.

4. Apparatus as defined in claim 3 wherein said transmission line transformers each comprise a conductive wire mounted in a cylindrical glass tube, and a plurality of toroid cores spaced equidistantly along a length of said tube.

5. Apparatus as defined in claim 4 wherein said conductive wire comprises a primary winding and said plurality of toroid cores comprise secondary windings of a transformer, said cores being equal in number to the number of series-connected FETs.

6. Apparatus as defined in claim 2 including a shunt discrete capacitance connected from the gate to source of each FET in said series-connected FETs.

7. Apparatus as defined in claim 6 including resistance means series connected with said output load for providing predetermined load damping and current limiting.

8. Apparatus as defined in claim 7 including means for preventing a false turn-on of the FETs of the first-mentioned series-connected FETs after the same have been disabled.

* * * * *